United States Patent [19]

Reylek et al.

[11] Patent Number: 4,610,908
[45] Date of Patent: Sep. 9, 1986

[54] INSULATED CONNECTED SHEET MATERIAL

[75] Inventors: Robert S. Reylek, Shoreview; James G. Berg, North Saint Paul, both of Minn.

[73] Assignee: Minnesota Mining and Manufacturing Company, St. Paul, Minn.

[21] Appl. No.: 730,256

[22] Filed: May 6, 1985

Related U.S. Application Data

[63] Continuation of Ser. No. 512,684, Jul. 11, 1983, abandoned, which is a continuation-in-part of Ser. No. 334,821, Dec. 28, 1981, abandoned.

[51] Int. Cl.$^4$ .............................................. B32B 3/10
[52] U.S. Cl. ........................... 428/141; 428/143; 428/156; 428/161; 428/168; 428/172; 428/195; 428/201; 428/206; 428/214; 428/323; 428/343; 428/346; 428/354; 428/355
[58] Field of Search ................................ 428/143, 355

[56] References Cited

U.S. PATENT DOCUMENTS

| | | | |
|---|---|---|---|
| 2,808,352 | 10/1957 | Coleman et al. | 428/344 |
| 2,964,587 | 12/1960 | Minot | 428/138 |
| 3,132,204 | 5/1964 | Giellerup | 174/117 A |
| 3,168,617 | 2/1965 | Richter | 174/117 FF |
| 3,311,696 | 5/1967 | Melnick | 428/139 |
| 3,514,326 | 5/1970 | Stow | 428/328 |
| 3,762,946 | 10/1973 | Stow et al. | 428/344 |
| 3,778,306 | 12/1973 | Stow | 428/356 |
| 4,113,981 | 9/1978 | Fujita et al. | 174/88 |
| 4,217,434 | 8/1980 | Koeble | 428/355 |
| 4,258,100 | 3/1981 | Fujitani et al. | 428/328 |
| 4,382,236 | 5/1983 | Suzuki | 428/209 |

FOREIGN PATENT DOCUMENTS 2018774 4/1971 Fed. Rep. of Germany . 174/117 FF
2758491 7/1979 Fed. Rep. of Germany . 174/117 FF Primary Examiner—George F. Lesmes
Assistant Examiner—William M. Atkinson
Attorney, Agent, or Firm—Donald M. Sell; James A. Smith; Gerald F. Chernivec

[57] ABSTRACT

Insulated sheet material useful for making bonded electrical connections, especially to sets of small side-by-side terminal pads. In one typical form, the sheet material is an elongated tape comprising an elongated insulating web; a plurality of narrow spaced parallel elongated electrically conductive stripes on the web; electrically conductive adhesive disposed over the stripes comprising a layer of adhesive material in which are dispersed a monolayer of rather thick electrically conductive particles; and a thin electrically insulating layer disposed over the conductive adhesive and which is nontacky or poorly tacky at room temperature, provides high electrical resistance throughout the layer to the conductive particles, softens to an adhesive and flowable condition upon heating to an elevated temperature, and upon cooling to room temperature assumes a firm and substantially nonflowable condition. Such a connector tape is readily handleable and free from conductive bonding at room temperature but when laid over a set of adjacent spaced terminal pads with the electrically conductive stripes in registry with the pads, and pressed and heated, the conductive particles penetrate through the insulating layer to make electrical connection to the pads.

29 Claims, 7 Drawing Figures

INSULATED CONNECTED SHEET MATERIAL

This application is a continuation of application Ser. No. 512,684, filed July 11, 1983 now abandoned, which is a continuation-in-part of the application Ser. No. 334,821, filed Dec. 28, 1981, abandoned.

TECHNICAL FIELD

This invention relates to sheet materials useful for making adhesive and electrical connections to electronic components.

BACKGROUND ART

There is a need in the electronic equipment industry for means for making convenient and secure electrical connections to sets of small side-by-side terminal pads, such as the terminal pads of a printed circuit board or a liquid crystal display. A promising technique for making such connections is taught in laid-open United Kingdom patent application No. 2,048,582A, filed Mar. 18, 1980 and published Dec. 10, 1980, which teaches an adhesive connector sheet material comprising a flexible insulative sheet, a plurality of parallel, separated, electrically conductive stripes carried on the sheet, and an electrically conductive adhesive covering the conductive stripes. Electrical connections can be made by adhering an end of the sheet material against a set of terminal pads, with individual stripes on the sheet material in alignment with individual pads.

For satisfactory use of sheet material as described, the electrically conductive adhesive in the sheet material must achieve a low-resistance bond that is stable for the length of time and under the operating conditions that are expected for the sheet material. Conventional electrically conductive adhesives have not provided the needed degree of stability and low resistance. Initial resistance is too high and/or resistance increases during use, to the extent that mechanical clamping techniques are often used to supplement the adhesive bond.

Also, a disadvantage of the described connector sheet material is that the electrically conductive adhesive covering the stripes can unintentionally be brought into contact with other members of an electronic assembly at intermediate portions along the length of the sheet material, thus introducing undesired electrical connections into the assembly. Such unintentional contacts could be avoided by covering the intermediate portion of the sheet material with an insulating layer, as has been done with some miniature flat cables of the prior art (see U.S. Pat. No. 4,113,981 which describes a cable comprising a flat sheet carrying electrically conductive stripes). However, such an intermediate covering of a cable is inconvenient and uneconomic, since it requires applying insulating material in specific lengths for specific uses. Application in specific lengths is a more difficult operation, and it requires maintaining an inventory of cables of different insulated lengths for different jobs. Alternatively, insulation must be removed from the end portions of the cable, which is difficult and not adapted to speedy automated operations.

DISCLOSURE OF INVENTION

The present invention provides a new electrically conductive adhesive sheet material which in preferred embodiments is insulated over its full adhesive surface and yet can be directly bonded and electrically connected to an electronic component in one operation. In one form this new product includes an electrically conductive layer, such as a layer of metal vapor-coated onto an insulating sheet, to provide electrical conductivity in the plane of the sheet material. In other forms such a conductive layer is omitted, and the adhesive sheet material is a "transfer" adhesive, which may be applied between adherends that have such conductive layers, or adhered to a tape having such a conductive layer, etc.

In both forms, sheet material of the invention generally comprises a polymeric or adhesive layer in which are dispersed a monolayer of discrete separated electrically conductive elements, such as metal particles, which are substantially as thick as or thicker than the layer. A thin electrically insulating layer is disposed over the monolayer of electrically conductive elements and comprises an electrically insulating material which is nontacky or poorly tacky at room temperature (i.e., 20° C.), provides an electrical resistance through the layer to the electrically conductive elements of at least about one megohm in the test described herein, softens to an adhesive and flowable condition upon heating to an elevated temperature, and upon cooling to room temperature resumes a firm and substantially nonflowable condition. The described sheet material is readily handleable and free from conductive bonding at room temperature, but, it may be pressed against a substrate and heated to make a bonded connection in which the electrically conductive elements extend through the insulating layer into electrical connection with the substrate.

The polymeric or adhesive layer in which the electrically conductive elements are dispersed is generally carried on a flexible backing, and one or more electrically conductive layers may also be carried on the backing or may constitute the backing. The adhesive layer preferably softens to an adhesive condition upon heating to an elevated temperature, and subsequently hardens to exhibit a firm and substantially nonflowable condition at room temperature. And the electrically conductive elements dispersed in the adhesive layer preferably have an average thickness greater than the average thickness of the adhesive layer, with the top edge of substantially each element being higher than at least part of the exterior surface of the adhesive layer surrounding the element.

During bonding of the described preferred sheet material to a substrate, the adhesive around a conductive element is pressed into contact with the substrate and forms an adhesive bond to the substrate. The backing, on which the adhesive layer is carried, is also pressed toward the substrate and conforms around the conductive element, which is thicker than the adhesive layer. The backing appears to be held in tension around the conductive element and to place the conductive element under compression against the substrate. With the adhesive layer in a firm and substantially nonflowable condition and with the electrically conductive elements held against the substrate, connections are formed that have low resistance and maintain that low resistance over a long useful life.

The utility of sheet material of the invention contrasts with previous experience with commercial pressure-sensitive adhesive connector tape products of the type described in U.S. Pat. No. 3,475,213. Those tapes use a pressure-sensitive adhesive layer coated onto an electrically conductive backing, typically a metal foil, with a monolayer of relatively large particles dispersed in the adhesive layer. The particles in these tapes were substantially the same thickness as the adhesive layer and sometimes were more thick than the adhesive layer. However, these tapes do not always achieve low-resistance electrical connections unless clamps are used to hold the tape against a substrate. Apparently, the force holding the particle against the substrate gradually decreases after the tape has been adhered in place as a result of flow of the adhesive.

Despite such prior experience, preferred sheet material of the invention incorporates a layer of an insulating material in sufficient thickness to provide electrical insulation and physical protection, and yet reliable and secure electric connections can be made through the insulating layer using heat and pressure. The heat and pressure cause the insulating material to be displaced from over the electric conductors, and the insulating material is retained in its displaced position by the cooling of the insulating material to a firm condition. A low-resistance electric connection is formed, which is retained over a long useful life.

Typically, sheet material of the invention takes the form of an elongated tape which is wound upon itself in roll form for convenience in storage and use. Also, a plurality of electrically conductive layers are typically included as narrow parallel elongated stripes, with the stripes supported on an elongated insulating web, laterally spaced from one another, and extending the length of the insulating web. Connections are thus conveniently made between terminal substrates which comprise a plurality of separated side-by-side terminal pads. However, other configurations of conductive stripes or paths besides parallel stripes are used in some embodiments of sheet material of the invention for special applications.

BEST MODE FOR CARRYING OUT THE INVENTION

Figure 1:
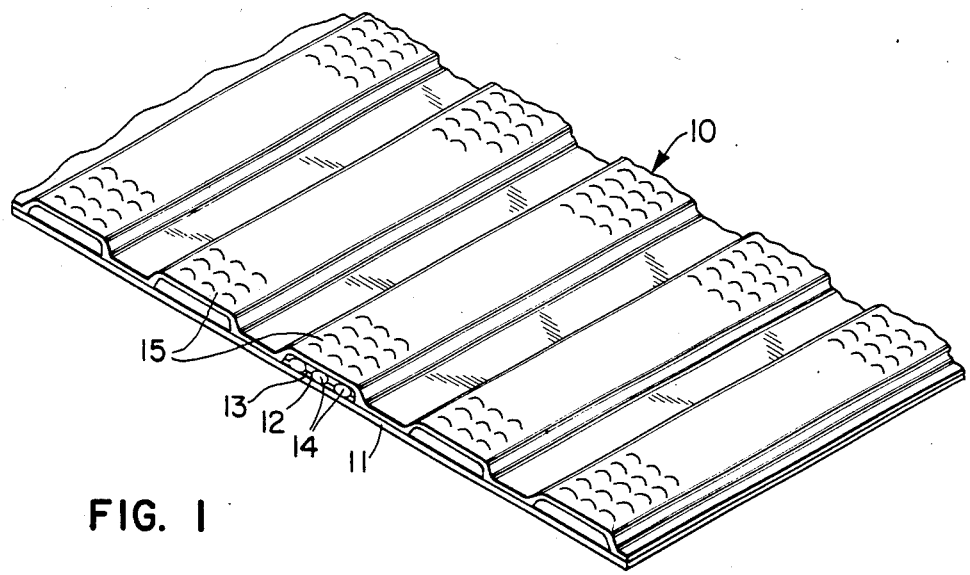
FIG. 1 is an enlarged perspective view of an end portion of an illustrative electrical connector tape of the invention.
Figure 2:
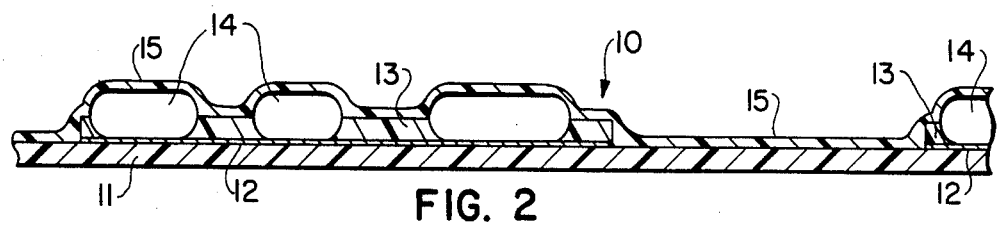
FIG. 2 is a sectional view through the illustrative electrical connector tape of the invention shown in FIG. 1.

The illustrative tape 10 shown in FIGS. 1 and 2 comprises a flat electrically insulating sheet 11, electrically conductive stripes 12, a non-conductive adhesive material 13 coated over the conductive stripes, electrically conductive particles 14 dispersed in the adhesive material, the collection of particles 14 causing the raised surfaces indicated in FIG. 1, and a thin layer 15 of electrically insulating material coated over the whole top surface of the tape.

The flat electrically insulating sheet 11 typically comprises a film, such as a film of polyethylene terephthalate or polyimide, or a resin-impregnated fibrous web. In preferred construction, the sheet should be flexible so that it will conform around the electrically conductive elements during a bonding operation and allow the adhesive carried on the backing to contact the substrate to which a bond is being made. Preferred films have a flexibility on the order of a 25- or 5-micrometer thick film of polyethylene terephthalate. However, less flexible films can be used, generally by using greater pressure during a bonding operation and by using somewhat thicker adhesive layers, so that the film need not conform as greatly as it does with thinner adhesive layers.

The electrically conductive stripes 12 typically comprise a layer of metal, such as silver, gold, aluminum, or copper vapor-deposited onto the flat sheet. Other conductive layers can be used instead, such as a metal foil (which may constitute the whole backing or may be adhered to the flat sheet with adhesive), or a layer of metal sputtered onto the flat sheet, or a layer formed from a conductive coating composition or ink, typically comprising a coating vehicle and conductors such as metal or carbon particles.

The adhesive material 13 is a heat-activated material which forms an adhesive bond during a heating operation. During the heating operation the adhesive material wets out a substrate to which adhesion is to be made. Subsequently, either by cooling or reaction of the ingredients, the adhesive hardens and sheet material of the invention and conductive particles are held in place with respect to an adherend. At this point the adhesive material is either nontacky or poorly tacky.

A preferred adhesive material, known as a "hot-tackifying adhesive," is described in a copending application of Robert H. Stow, Ser. No. 445,864, filed Dec. 6, 1982. As described in that application, the adhesive material is nontacky or poorly tacky at 20° C., but becomes pressure-sensitive and aggressively tacky when heated. Good bonds are immediately formed at a tackifying temperature without any need for crosslinking or other chemical reactions. The adhesive material comprises an acrylic polymer or mixture of acrylic polymers of at least one alkyl acrylate and/or methacrylate ester monomer (here called "acrylic ester monomer"), and differs from prior art adhesive materials in that:

(1) acrylic ester monomer provides at least 50 mol percent of the one or more acrylic polymers of the adhesive layer, (2) said one or more acrylic polymers have a $T_g$ (glass transition temperature) or a weight-averaged $T_g$ of $-10°$ to $80°$ C., (3) a layer of the adhesive material has
  (a) a Probe Tack Value (as defined below) of less than 75 grams of force (gf) at 20° C.,
  (b) Probe Tack Values of at least 75 gf over a range of at least 50° C., which values remain substantially constant after 30 days at 40° C., and
  (c) a Shear Value (as defined below) of at least 25 minutes at 65° C., and (4) up to 50 mol percent of the one or more acrylic polymers can be provided by copolymerizable monomer having a polar group, such as acrylic acid, methacrylic acid, itaconic acid, maleic acid or anhydride, the amides of said acids, acrylonitrile, methacrylonitrile, and N-vinyl-2-pyrrolidone.

The one or more acrylic polymers may be a homopolymer of an acrylic ester monomer which provides a $T_g$ within the range of $-10°$ to 80° C., e.g., methyl acrylate, or a copolymer of acrylic ester monomer and copolymerizable polar monomer having a $T_g$ within that range. Useful acrylic ester monomers which homopolymerize to a $T_g$ at least $-10°$ include methyl acrylate, methyl methacrylate, ethyl methacrylate, propyl methacrylates, butyl methacrylates, bornyl acrylates, bornyl methacrylates, 2-phenoxyethyl acrylate, 2-phenoxymethyl acrylate, the mono- and di-methyl and ethyl esters of itaconic acid, and the mono- and di-methyl and ethyl esters of maleic acid. Useful acrylic ester monomers which provide reduced $T_g$ include ethyl, butyl, and octyl acrylates, and n-amyl, hexyl and octyl methacrylates. A copolymer of 43 mol percent of methyl methacrylate, 53 mol percent of methyl acrylate and 4 mol percent of acrylamide had a $T_g$ of about 50° C. A copolymer of 73 mol percent of methyl methacrylate, 19 mol percent of methyl acrylate, 4 mol percent of ethyl acrylate, and 4 mol percent of acrylamide had a $T_g$ of about 79° C.

The described hot tackifying adhesive material becomes pressure-sensitive and aggressively tacky when heated, typically for use in this invention to a temperature of about 40° C. or above, and preferably 75° C. or above. When later subjected to temperatures at or even above the bonding temperature, adequate bonding strength may be retained. Electrically conductive particles may be dispersed into the adhesive material to form a conductive bond, and the particles and adherends tend to be retained in their bonded positions by the firm adhesive material at elevated temperatures as well as room temperature.

Other copolymerizable monomers may also be employed in small amounts without detracting from the value of the acrylic copolymer for the purposes taught in the application. Among such copolymerizable monomers are styrene, vinyl acetate and vinyl chloride, each of which can be used in amounts of up to about 5 mol percent of the total monomers.

Other heat-activated adhesive materials that can be used are hot-melt adhesive materials, which are typically thermoplastic materials that soften to a flowable state and then cool to form an adhesive bond, and reactive compositions, such as epoxy-based adhesives. Sheet material in which the adhesive is pressure-sensitive at room temperature may also benefit from the present invention, i.e., by the use of electrically conductive elements in a size relationship as taught herein with the layer of pressure-sensitive adhesive on a flexible backing, especially under circumstances in which the bonded electrical connection to be made with the sheet material does not experience high ambient temperatures and pressures.

The conductive particles 14 in the sheet material of the invention shown in FIGS. 1 and 2 are flattened to a generally common thickness. For example, a sieved batch of originally spherical particles may be passed through nip rolls such as in a plant mill; see U.S. Pat. No. 3,475,213. The flattened particles are especially desirable because they tend to lie on their flattened side, and a high percentage of the particles participate in conducting electrically through the adhesive layer in an adhesive bond. Spherical particles are also useful, especially when screened within narrow size ranges so that a high percentage of the particles are of about the same size. The particles should be sufficiently firm or rigid so as to penetrate through the insulating layer during a bonding operation. The particles are usually metal, preferably silver but alternatively copper or aluminum (for which additives as described in U.S. Pat. No. 3,475,213 are desirable to achieve compatibility), or various other metals, metallized particles such as glass beads, carbon particles, etc. Also, electrically conductive elements may take the form of material embossed from a conductive backing, such as the embossed protrusions from a metal foil taught in U.S. Pat. No. 3,497,383. Or small particles clustered closely together may comprise an electrically conductive element.

The particles can range in thickness from at least 10 to 500 micrometers, though the preferred range for presently contemplated products is about 20 to 100 micrometers, and the adhesive layer can range in thickness from at least 6 to 450 micrometers. (The average thickness of the adhesive layer is determined by measuring the approximate volume of adhesive material in the layer, and dividing that volume by the area of the sheet material.) It is generally difficult to obtain good adhesive bonds to a substrate if the average thickness of the adhesive layer is less than about sixty percent (60%) of the average thickness of the electrically conductive elements, but lasting row-resistance electric connections are achieved in preferred constructions by making the adhesive layer significantly thinner than the electrically conductive elements, i.e., with an average thickness generally about ninety percent (90%) or less of the average thickness of the conductive elements. Best results are obtained when the average thickness of the adhesive layer is about 70 to 80 percent of the average thickness of the electrically conductive elements.

As a corollary to the above discussion, and as a further contribution to lasting low-resistance electric connections, the top edge of substantially all the electrically conductive elements in preferred constructions is higher than at least part of the adhesive layer surrounding the particles. That is, the dimension 16 of substantially each particle 14 in FIG. 1 is greater than the dimension 17 of the adhesive layer at at least some points on the exterior surface of the adhesive by surrounding the particle. Preferably, the whole of substantially each particle is encircled by an area of the adhesive layer that is less high than the top edge of the electrically conductive element. Also, the electrically conductive elements are preferably substantially all separated on average by at least the average diameter of the elements, and more typically four or five times or more the average diameter, so as to allow the backing to conform around the elements during a bonding operation. On the other hand, the electrically conductive elements preferably occupy at least 2 percent, and more preferably at least 4 percent, of the area of the sheet material.

Figure 3:
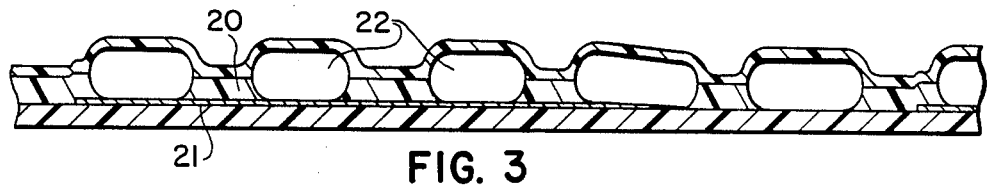
FIGS. 3–6 are sectional views through different illustrative electrical connector tapes of the invention.

The layer 15 of electrically insulating material provides useful electrical insulation even though it should be thin, on the order of 10 micrometers in thickness over the conductive particles 14 in a construction as shown in FIGS. 2-3. Resistance through the layer 15 to the conductive particles of at least one megohm is preferably achieved. Resistance is measured by laying a test sample over a one-centimeter-square copper substrate, with the exterior surface of the insulation layer of the sample against the substrate, and laying a 500-gram weight over the test sample at room temperature. Electrical connection has previously been made between a metal conductor and the conductive layer in the test sample, e.g., the stripes 12 in the sheet material shown in FIGS. 1 and 2, by heat and pressure. A voltage of 5 volts is applied to the metal conductor, with the copper substrate maintained at ground, and the resistance in the circuit measured.

The insulating layer 15 preferably comprises the same or a similar material as the adhesive material 13 in which the conductive particles 14 are dispersed. The hot-tackifying adhesive taught in the previously mentioned copending application is a preferred material. One advantage is that it is adhesive over a wide temperature interval so that adhesive connections can be maintained even though the bond area has not cooled to room temperature. In some cases the insulating layer may comprise a different variety of hot-tackifying adhesive, such as a variety having a lower glass transition temperature ($T_g$) than the adhesive material in which conductive particles are dispersed. The higher-$T_g$ adhesive material offers greater firmness at room temperature, while the lower-$T_g$ insulating layer flows readily and assists in formation of a desired adhesive bond. Other adhesive materials such as hot-melt adhesives or reactive compositions may also be used.

In the embodiment of sheet material shown in FIGS. 1 and 2, the particles 14 are only partially embedded in the layer of non-conducting adhesive material 13. Also, the insulating layer 15 is of a rather constant thickness and conforms to the profile left by the protruding particles. The result is that there is generally a small valley between adjacent particles, into which insulating material may advantageously be displaced during a bonding operation. The displacement of insulating material is also aided by the fact that the adhesive material 13 and particles 14 are disposed over only the electrically conductive stripes 12, thus leaving a further valley between adjacent stripes.

In less preferred embodiments of sheet material of the invention the exterior surface of the insulating layer is planar, as for example, when the conductive particles are immersed in an adhesive layer substantially as thick as the particles. Such embodiments are preferably used with terminal substrates that apply higher pressure at the locations where a bond is to be made so as to displace the insulating material. For example, the terminal pads may be slightly raised so as to apply additional pressure on the insulating and adhesive materials between the terminal pads and electrically conductive stripes or layer.

The embodiment of sheet material shown in FIGS. 1 and 2 illustrates another desirable feature of sheet material of the invention. That is, it is desirable for the adhesive surface of the sheet material to be profiled, with at least part of the surface of the adhesive, for example, the part that overlies spaces between the electrically conductive stripes, being recessed below other areas of the adhesive surface. Accordingly, some adhesive material in the area of the conductive stripes can be displaced during the bonding operation into the recessed areas between the stripes, and the electrically conductive elements become held in closer electrical association with the substrate. Such displacement occurs in proportion to the degree of flowability of the adhesive material and the degree of heat and pressure applied to the adhesive material during the bonding operation. A hot-tackifying adhesive material may not flow extensively during a bonding operation, so that the flexible backing may conform to the profiled thickness of the adhesive layer. Desirably recessed areas of the adhesive layer are recessed at least 10 percent and preferably at least 25 percent, below the average height of the non-recessed areas of the adhesive layer. The insulating layer 15 in the embodiment of FIGS. 1 and 2, is of a rather constant thickness and conforms to the profile left by the protruding particles and adhesive material 13.

After bonding to a substrate, the contact surface of sheet material of the invention generally follows the surface of the substrate. The terminal substrates with which sheet material of the invention is used may be planar, with terminal pads embedded in the substrate and coplanar with the rest of the substrate, in which case sheet material of the invention forms a generally planar full-area contact with the substrate. Preferably, however, as discussed above, the terminal pads are slightly raised. In the finished bond the electrically conductive elements occupy a sufficient proportion of the thickness of the adhesive bond to allow any necessary dielectric breakdown through the adhesive material and achieve conduction between the conductive stripe and a substrate to which the sheet material is adhered. Preferably, the electrically conductive elements occupy a minor proportion of the area in the plane of a bond so as to leave substantial area in which adhesive contacts the adherend, and they cover a small area relative to the area of the electrically conductive stripes.

Together, the adhesive material and electrically conductive elements provide an electrically conductive adhesive layer which is conductive through the layer but not laterally within the layer. As shown in FIG. 3, in some embodiments of the invention electrically conductive adhesive 20 extends over the whole surface of one side of sheet material of the invention, thereby avoiding the necessity for limited coating of the electrically conductive adhesive over only an electrically conductive stripe. Since the electrically conductive adhesive is not conductive laterally, the adjacent stripes 21 remain electrically isolated from one another. The conductive particles 22 in the electrically conductive adhesive make connection only through the adhesive layer from the electrically conductive stripe 21 to a terminal pad with which the stripe is aligned.

Figure 4:
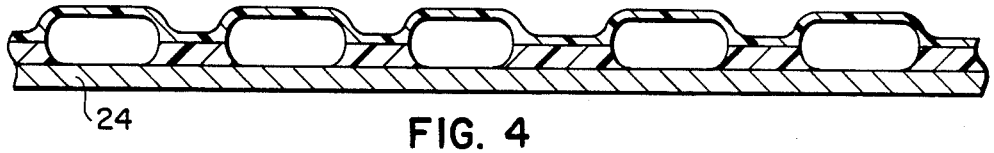

Another variety of sheet material of the invention shown in FIG. 4 includes an electrically conductive backing 24 which extends over the full extent of the sheet material. Sheet material having such a backing, which may take the form, for example, of a metal foil or a metal-coated polymeric film, is useful for making ground connections, as between a metal chassis and a part mounted on the chassis.

Figure 5:
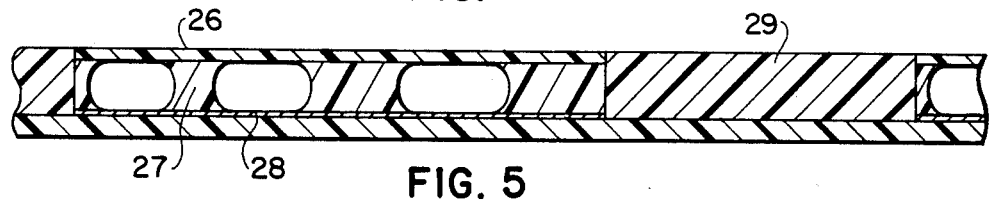

FIG. 5 illustrates a different embodiment of the invention in which both an insulating layer 26 and electrically conductive adhesive 27 are applied over only the electrically conductive stripes 28, and the spaces between the stripes are filled with a different adhesive 29. For example, a pressure-sensitive adhesive may be used to give the sheet material room-temperature adhesion to a substrate, which is later supplemented by heating the insulating layer and electrically conductive adhesive over the stripes 28 to an adhesive condition. Also, a hot-melt or reactive adhesive could fill the spaces between stripes.

Figure 7:
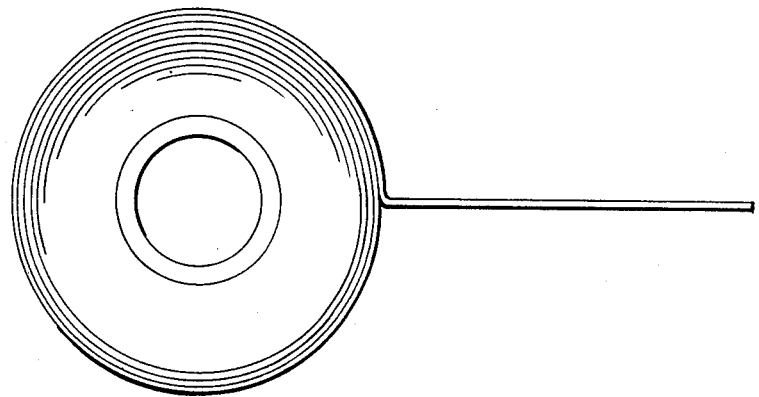
FIG. 7 is a side elevation view of an illustrative tape of the invention wound in roll form.

Sheet material of the invention, especially when an elongated tape to be wound upon itself in roll form, (see FIG. 7) preferably includes a low-adhesion backsize on the non-adhesive side, or a release liner disposed over the insulating layer. Also, primers may be applied to a polymeric or metallic backing to promote adhesion to an adhesive or insulating layer carried on the backing.

Figure 6:
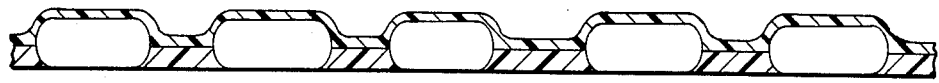

Sheet material of the invention is generally applied by aligning an end of the tape over the desired substrate to which connection is to be made, pressing the sheet material against the substrate, and at the same time heating the sheet material. Transfer adhesive sheet materials of the invention may be placed between desired adhesives and a bonded electrical connection made by applying heat and pressure. In such transfer adhesive sheet materials electrically conductive elements may be dispersed in an adhesive material which forms a support web for the elements, and an insulating layer may be disposed on one or both sides of the particle-containing web (see FIG. 6) and the elements may protrude from both sides of the web. Alternatively, the material in which the particles is dispersed in a non-adhesive polymer film, and adhesion is provided by the insulating layer. Similarly, the layer 13 in a product as shown in FIGS. 1 and 2 may be non-adhesive, e.g., because of reaction to a durable, film state.

The invention will be further illustrated by the following examples.

EXAMPLE 1

A film of polyethylene terephthalate 25 micrometers thick was vapor-coated on one surface through a slotted mask to form 875-micrometer-wide continuous stripes of silver spaced 875 micrometers apart. The stripes were approximately 400 angstroms (40 nanometers) thick and had an electrical resistance of 4 ohms per centimeter length. Electrically conductive adhesive was prepared by mixing 94.9 volume-parts of acrylic terpolymer which comprised 10.4 weight-percent methyl methacrylate, 85.6 weight-percent methyl acrylate, and 4 weight-percent acrylamide dissolved in ethyl acetate, and 5.1 volume-parts of silver particles. The particles had been sieved through a 140-mesh screen (U.S. standard; 105 micrometer mesh size) and retained on a 170-mesh screen (88 micrometers) and then passed through a roller mill to flatten the particles to approximately 48 micrometers thickness. The mixture of adhesive and particles was applied in registry over the conductive stripes by coating through an apertured mask. After drying, the adhesive terpolymer occupied a thickness of approximately 20 micrometers.

An insulating layer of acrylic terpolymer comprising 40 weight-percent ethyl acrylate, 56 weight-percent methyl acrylate, and 4 weight-percent acrylamide dissolved at about 25 weight-percent solids in ethyl acetate was then applied over the whole surface of the sheet material by bar coating, thereby covering the adhesive-coated stripes and the film backing between the stripes. After drying, a rather constant-thickness layer approximately 10 micrometers thick was formed, as shown in FIG. 2. The ratio of the combined thickness of the adhesive layer and insulating layer (30 micrometers) to the average thickness of the particles was 62.5 percent.

The resistance through the layer as measured by the method described above was about 1000 megohms. For comparison a similar tape without the insulating layer was prepared and found to exhibit 10 ohms resistance.

One end of the tape of this example was adhered to the electrically conductive terminal pads of a printed circuit test board by pressing the tape against the substrate with a force of 150 pounds per square inch (10.5 kilograms per square centimeter) and heating the end of the tape to a temperature of 170° C. for 5 seconds. After the connection had been allowed to cool, the resistance at the connection was measured by the four terminal resistance method and found to be 10 milliohms. The backing was roughened in the manner shown in FIG. 2. The peel strength of the bond to the substrate was also measured according to ASTM D-1000 and found to be 2.5 to 5 pounds per inch width (0.45 to 0.9 kilograms per centimeter).

EXAMPLE 2

Two different tapes of the type described in Example 1 were prepared using particles having a flattened thickness of approximately 40 micrometers, sufficient adhesive material in mixture with the particles to provide an adhesive layer approximately 15 micrometers in thickness, and insulating layers of two different thicknesses—one (Example 2A) approximately 9 micrometers and the other (Example 2B) approximately 21 micrometers. The ratio of the combined thickness of the adhesive layer and insulating adhesive layers to the average particle was 60% for Example 2A and 90% for Example 2B. Pieces of tape were cut to size and bonded between the conductive pads of a printed circuit board and indium tin oxide (ITO) vaporcoated surface on a glass test panel using a pressure of 200 psi at 150° C. for five seconds. The multiple connections made by each tape to the ITO test panel were monitored for individual contact resistances using a four-wire ohms method. The test panel was cycled between −40° C. and 105° C. every four hours. Table I below shows the results for the maximum contact resistance observed during the reported test period. The data demonstrates stable electrical performance during the stated thermal cycling for the construction using adhesive thickness in the range of 60 percent of particle thickness, and poor electrical performance when adhesive thickness is 90 percent of particle thickness. In other tests, with less temperature cycling and shorter times, tapes with a 90 percent adhesive thickness to particle thickness ratio have provided adequate stability.

TABLE I

Effects of Adhesive Thickness on Performance in Thermal Age Testing

| Example No. | Ratio of Adh/particle Thickness (%) | Maximum Individual Conductor Bond Resistance to ITO Surface (Ohms) | | |
|---|---|---|---|---|
| | | Initial | 100 hours | 1000 hours |
| 2A | 60 | 242 | 289 | 167 |
| 2B | 90 | 267 | >10,000 | >10,000 |

[1]The Probe Tack Value is determined as described in ASTM D-2979 except in the following respects:
1. To provide Probe Tack Values at various test temperatures, the probe and the annular weight are heated to the test temperature, except that the annular weight is never heated above 220° C.
2. The probe end is an annulus having inner and outer diameters of 3.83 and 5.10 mm.
3. The annular weight is 19.8 grams.
4. Ten-second dwell.

[2]The Shear Value is determined by heating a bright annealed stainless steel panel in an oven for 15 minutes at 115° C. above the weight-averaged $T_g$ of the adhesive polymer. With the steel panel horizontal, part of a tape 1.27 cm in width is adhered to the steel panel using a 2.04-kg hand roller conforming to Federal Standard 147, giving 2 passes in each direction. The length of tape adhering to the panel is trimmed to exactly 1.27 cm in length and this assembly is left at the bonding temperature for 15 minutes longer. The plate is transferred to an oven having a shear stand which allows a 2° backward tilt of the panel at its top (shear weight will force tape toward panel slightly). After 15 minutes at 65° C., a one-kilogram weight is hung from the free end of the tape. The time after which the weight falls is the 65° C. Shear Value.

What is claimed is as follows:
1. An electrical connector tape wound upon itself in roll form for convenience in storage and use comprising an elongated electrically insulating web;
a plurality of narrow parallel elongated electrically conductive stripes supported and held on the insulating web in laterally spaced relation and extending the length of the insulating web;
electrically conductive heat-activated adhesive disposed over said stripes by which the stripes can be conductively bonded to a substrate at all points along the length of the stripes; said adhesive comprising a layer of adhesive material in which are dispersed electrically conductive particles substantially as thick as or thicker than said layer of adhesive material; and a thin layer covering said electrically conductive adhesive and comprising an electrically insulating material, the exterior surface thereof being contoured, with portions located above electrically conductive areas being higher than surrounding areas, wherein said insulating material is nontacky or poorly tacky at room temperature, softens to an adhesive and flowable condition upon heating to an elevated temperature, and upon cooling at room temperature assumes a firm and substantially nonflowable condition, whereby the connector tape is readily handleable and free from conductive bonding at room temperature but may be laid over a set of adjacent spaced terminal pads with the electrically conductive stripes in registry with the pads and pressed and heated to make bonded electrical connections to the pads.

2. Connector tape of claim 1 in which electrically conductive adhesive extends over the insulating web covering both the electrically conductive stripes and spaces between the stripes.

3. Connector tape of claim 1 in which electrically conductive adhesive is disposed over only the electrically conductive stripes; the outer surface of the electrically conductive adhesive is elevated above the outer surface of the tape between the electrically conductive stripes; and the thin layer of electrically insulating material extends over the whole web and is asubstantially constant-thickness layer which follows the contour of the elevated adhesive-covered electrically conductive stripes and non-elevated areas between the stripes.

4. Connector tape of claim 1 in which the electrically conductive adhesive comprises the same monomeric ingredients as the electrically insulating layer.

5. Connector tape of claim 1 in which at least one of the insulating layer and the adhesive layer comprises a hot tackifying adhesive which exhibits a probe tack value of at least 75 grams of force at a temperature of 40° C. or more.

6. Connector tape of claim 1 in which at least one of the adhesive layer and insulating layer comprises one or more acrylic polymers and
   (1) acrylic ester monomer provides at least 50 mol percent of the one or more acrylic polymers of said at least one layer,
   (2) said one or more acrylic polymers have a $T_g$ or a weight-averaged $T_g$ of $-10°$ to 80° C., and
   (3) said at least one layer has
      (a) a Probe Track Value of less than 75 gf at 20° C.,
      (b) Probe Tack Values of at least 75 gf over a range of at least 50° C., which values remain substantially constant after 30 days at 40° C., and
      (c) a Shear Value of at least 25 minutes at 65° C., said at least one layer adheres well to a clean substrate upon contact at any temperature within said 50° C. range.

7. Connector tape of claim 6 in which said at least one layer comprises one or more acrylic copolymer of monomers, up to 50 mol % of which is at least one copolymerizable monomer selected from the group consisting of acrylic acid, methacrylic acid, itaconic acid, maleic acid, maleic anhydride, amides of said acids, acrylonitrile, methacrylonitrile, and N-vinyl-2-pyrrolidone.

8. Connector tape of claim 6 in which the acrylic ester monomer is selected from the goup consisting of alkyl acrylates having 1–8 carbon atoms in their alkyl groups, alkyl methacrylates having 1–8 carbon atoms in their alkyl groups, bornyl acrylates, bornyl methacrylates, 2-phenoxyethyl acrylate, 2-phenoxymethyl acrylate, the monoand di-methyl and ethyl esters of itaconic acid, and the monoand di-methyl and ethyl esters of maleic acid.

9. Connector tape of claim 6 in which at least one of styrene, vinyl acetate and vinyl chloride comprises up to 5 mol % of the total monomers.

10. Sheet material adapted to make bonded electrical connections to a substrate comprising (1) an adhesive layer which softens to an adhesive condition upon heating to an elevated temperature, and subsequently hardens to exhibit a firm and substantially nonflowable condition at room temperature; (2) a monolayer of discrete separated electrically conductive elements dispersed in the adhesive layer; the electrically conductive elements having an average thickness greater than the average thickness of the adhesive layer, and the top edge of substantially each element being higher than at least part of the exterior surface of the adhesive layer surrounding the element; and (3) a thin layer of electrically insulating material disposed over the monolayer of electrically conductive elements, the exterior surface thereof being contoured, with portions located above electrically conductive areas being higher than surrounding areas, said layer of insulating material being nontacky or poorly tacky at room temperature, softening to an adhesive and flowable condition upon heating to an elevated temperature, and upon cooling to room temperature assuming a firm and substantially nonflowable condition.

11. Sheet material of claim 10 in which at least one of the adhesive layer and electrically insulating layer comprises a hot tackifying adhesive which exhibits a probe tack value of at least 75 grams of force at a temperature of 40° C. or more.

12. A Sheet material of claim 10 which further includes at least one electrically conductive layer supported by an electrically insulating web, and the adhesive layer is disposed in contact with the conductive layer.

13. Sheet material of claim 12 wherein said electrically conductive layer comprises a plurality of narrow parallel elongated electrically conductive stripes covering a limited portion of said insulating web.

14. Sheet material of claim 13 in which the electrically conductive adhesive layer extends over only said plurality of electrically conductive stripes.

15. Sheet material of claim 14 in which electrically conductive elements are disposed over only said electrically conductive stripes.

16. Sheet material adapted to make bonded electrical connections to a substrate comprising
   an electrically conductive adhesive layer comprising a non-conductive heat-activated adhesive material in which are dispersed a monolayer of discrete separated electrically conductive elements substantially as thick as or thicker than the adhesive layer; and
   a thin electrically insulating layer disposed over said monolayer of electrically conductive elements, the exterior surface thereof being contoured, with portions located above electrically conductive areas being higher than surrounding areas, said insulating layer being nontacky or poorly tacky at room temperature, providing an electrical resistance through the layer to the electrically conductive elements, of at least one megohm, softening to an adhesive and flowable condition upon heating to an elevated temperature, and upon cooling to room temperature assuming a firm and substantially nonflowable condition, whereby the sheet material is readily handleable and free from conductive bonding at room temperature but may be pressed against said substrate and heated to make a bonded electrical connection in which said conductive elements extend through the insulating layer to the substrate.

17. Sheet material of claim 16 in which at least one of the adhesive layer and electrically insulating layer comprises a hot tackifying adhesive which exhibits a probe tack value of at least 75 grams of force at a temperature of 40° or more.

18. Sheet material of claim 16 in which at least one of the adhesive layer and insulating layer comprises one or more acrylic polymers and
    (1) acrylic ester monomer provides at least 50 mol percent of the one or more acrylic polymers of said at least one adhesive layer,
    (2) said one or more acrylic polymers have a $T_g$ or a weight-averaged $T_g$ of $-10°$ to $80°$ C., and
    (3) said at least one layer has
        (a) a Probe Tack Value of less than 75 gf at 20° C.,
        (b) Probe Tack Values of at least 75 gf over a range of at least 50° C., which values remain substantially constant after 30 days at 40° C., and
        (c) a Shear Value of at least 25 minutes at 65° C., and
    said at least one layer adheres well to a clean substrate upon contact at any temperature within said 50° C. range.

19. Sheet material of claim 18 in which said at least one layer comprises one or more acrylic copolymers of monomers, up to 50 mol % of which is at least one copolymerizable monomer selected from the group consisting of acrylic acid, methacrylic acid, itaconic acid, maleic acid, maleic anhydride, amides of said acids, acrylonitrile, methacrylonitrile, and N-vinyl-2-pyrrolidone.

20. Sheet material of claim 18 in which the acrylic ester monomer is selected from the group consisting of alkyl acrylates having 1–8 carbon atoms in their alkyl groups, alkyl methacrylates having 1–8 carbon atoms in their alkyl groups, bornyl acrylates, bornyl methacrylates, 2-phenoxyethyl acrylate, 2-phenoxymethyl acrylate, the monoand di-methyl and ethyl esters of itaconic acid, and the mono- and di-methyl and ethyl esters of maleic acid.

21. Sheet material of claim 18 in which at least one of styrene, vinyl acetate and vinyl chloride comprises up to 5 mol % of the total monomers.

22. Sheet material of claim 3 which further includes at least one electrically conductive layer supported by an insulating web, and the adhesive layer is disposed in contact with the conductive layer.

23. Sheet material of claim 22 wherein said electrically conductive layer comprises a plurality of narrow parallel elongated electrically conductive stripes covering a limited portion of said insulating layer.

24. Sheet material of claim 23 in which electrically conductive elements, are disposed over only said electrically conductive stripes.

25. Sheet material of claim 23 in which electrically conductive adhesive extends over the insulating web covering both the electrically conductive stripes and spaces between the stripes.

26. Sheet material of claim 23 in which the electrically conductive adhesive layer extends over only said plurality of electrically conductive stripes.

27. Sheet material of claim 26 in which said insulating layer is disposed over only the electrically conductive stripes.

28. Sheet material of claim 26 in which said insulating layer extends over the insulating web covering both the electrically conductive stripes and spaces between the stripes.

29. Sheet material of claim 26 in which a different adhesive material is dispersed between the electrically conductive stripes.

* * * * *

UNITED STATES PATENT AND TRADEMARK OFFICE
CERTIFICATE OF CORRECTION

PATENT NO. : 4,610,908

DATED : September 9, 1986

INVENTOR(S) : ROBERT S. REYLEK and JAMES S. BERG

It is certified that error appears in the above-identified patent and that said Letters Patent is hereby corrected as shown below:

Column 3, line 68, "5-micrometer" should read --50-micrometer--.

Column 5, line 50, "plant" should read --paint--.

Column 9, line 7, "polymer" should read --polymeric--.

Column 14, line 15 (Claim 22), "claim 3" should read --claim 16--.

Signed and Sealed this

Sixteenth Day of December, 1986

Attest:

DONALD J. QUIGG

Attesting Officer     Commissioner of Patents and Trademarks